(12) United States Patent
Qi et al.

(10) Patent No.: US 10,475,627 B2
(45) Date of Patent: Nov. 12, 2019

(54) CARRIER RING WALL FOR REDUCTION OF BACK-DIFFUSION OF REACTIVE SPECIES AND SUPPRESSION OF LOCAL PARASITIC PLASMA IGNITION

(71) Applicant: Lam Research Corporation, Fremont, CA (US)

(72) Inventors: Chengzhu Qi, Tualatin, OR (US); Yukinori Sakiyama, West Linn, OR (US); Bin Luo, Tigard, OR (US); Douglas Keil, West Linn, OR (US); Pramod Subramonium, Portland, OR (US); Chunhai Ji, Portland, OR (US); Joseph Lindsey Womack, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 50 days.

(21) Appl. No.: 15/080,961

(22) Filed: Mar. 25, 2016

(65) Prior Publication Data

US 2017/0278681 A1    Sep. 28, 2017

(51) Int. Cl.
*H01J 37/32*    (2006.01)
*H01L 21/02*    (2006.01)
(Continued)

(52) U.S. Cl.
CPC .... *H01J 37/32715* (2013.01); *C23C 16/4585* (2013.01); *C23C 16/50* (2013.01);
(Continued)

(58) Field of Classification Search
CPC ..... H01L 21/68; C23C 16/4585; B24B 37/27; B24B 37/32
See application file for complete search history.

(56) References Cited

U.S. PATENT DOCUMENTS 3,436,255 A * 4/1969 Westhoff ................ C30B 25/12
                                                              117/88
4,978,567 A * 12/1990 Miller ...................... C23C 14/50
                                                              117/900

(Continued)

OTHER PUBLICATIONS

Silicon Valley Microelectronics. Silicon Wafer Publication. Accessed Jul. 10, 2017.*

*Primary Examiner* — Tyrone V Hall, Jr.
(74) *Attorney, Agent, or Firm* — Penilla IP, APC

(57) ABSTRACT

A carrier ring configured to support a substrate during transport to or from a pedestal of a process tool and surrounding the substrate during processing is defined by, an inner annular portion having a first thickness, the inner annular portion defined to be adjacent a substrate support region of the pedestal; a middle annular portion surrounding the inner annular portion, the middle annular portion having a second thickness greater than the first thickness, such that a transition from a top surface of the inner annular portion to a top surface of the middle annular portion defines a first step; an outer annular portion surrounding the middle annular portion, the outer annular portion having a third thickness greater than the second thickness, such that a transition from the top surface of the middle annular portion to a top surface of the outer annular portion defines a second step.

18 Claims, 11 Drawing Sheets

(51) Int. Cl.
  *C23C 16/50* (2006.01)
  *C23C 16/458* (2006.01)
  *H01L 21/67* (2006.01)
  *H01L 21/687* (2006.01)

(52) U.S. Cl.
  CPC .. *H01J 37/32467* (2013.01); *H01J 37/32623* (2013.01); *H01J 37/32642* (2013.01); *H01J 37/32733* (2013.01); *H01L 21/02274* (2013.01); *H01L 21/6719* (2013.01); *H01L 21/67201* (2013.01); *H01L 21/68735* (2013.01); *H01L 21/68742* (2013.01); *H01L 21/68771* (2013.01)

(56) References Cited

U.S. PATENT DOCUMENTS

| | | | | |
|---|---|---|---|---|
| 5,058,526 | A * | 10/1991 | Matsushita | C23C 16/54 118/715 |
| 5,584,936 | A * | 12/1996 | Pickering | C23C 16/4583 118/500 |
| 6,048,403 | A * | 4/2000 | Deaton | C23C 16/4583 118/500 |
| 7,722,441 | B2 * | 5/2010 | Goela | C23C 16/345 428/848.1 |
| 2005/0155718 | A1 * | 7/2005 | Huang | H01J 7/32633 216/34 |
| 2015/0270155 | A1 * | 9/2015 | Hochstetler | H01L 21/67046 269/55 |

* cited by examiner

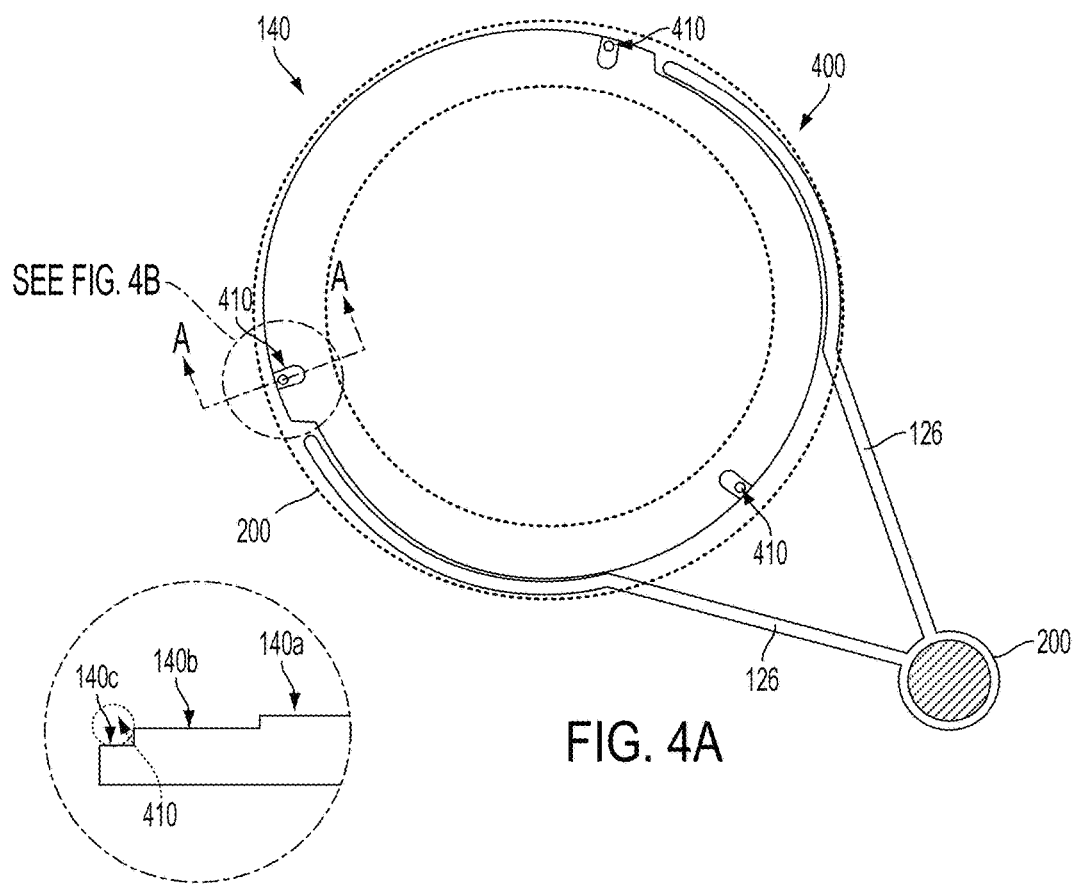
FIG. 4A
FIG. 4B
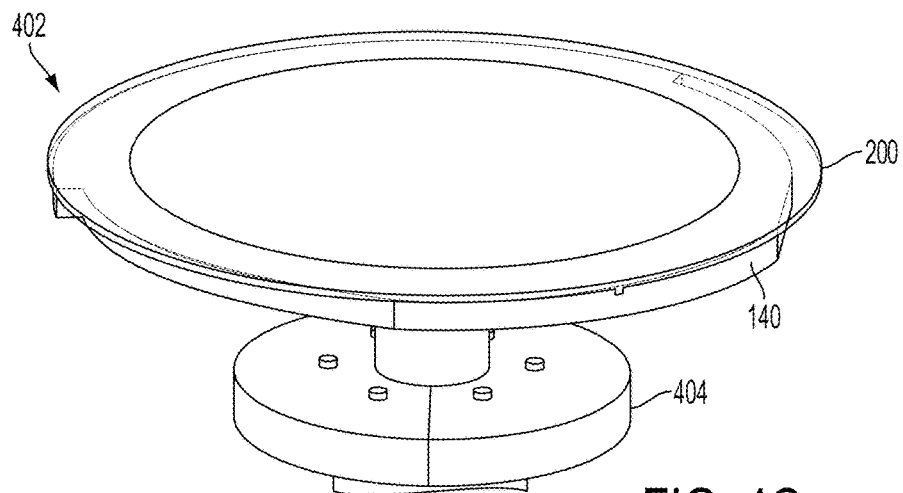
FIG. 4C

CARRIER RING WALL FOR REDUCTION OF BACK-DIFFUSION OF REACTIVE SPECIES AND SUPPRESSION OF LOCAL PARASITIC PLASMA IGNITION

BACKGROUND

1. Field of the Invention

The present embodiments relate to semiconductor substrate processing equipment tools, and more particularly, carrier rings used in chambers for processing and transport of substrates.

2. Description of the Related Art

Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor. Chambers used for PECVD use ceramic pedestals for supporting the wafer during processing. A carrier ring is employed to support a given wafer during transport to or from the chamber. Examples of films that may be deposited by PECVD include silane ($SiH_4$) based PECVD films such as SiN, $SiO_2$, poly-Si, etc.

It is in this context that implementations of the disclosure arise.

SUMMARY

Embodiments of the disclosure provide embodiments of a carrier ring used in deposition chambers.

In some implementations, a carrier ring configured to support a substrate during transport to or from a pedestal of a process tool and surrounding the substrate during processing is provided, the carrier ring defined by, an inner annular portion having a first thickness, the inner annular portion defined to be adjacent a substrate support region of the pedestal that is configured to receive the substrate during processing; a middle annular portion surrounding the inner annular portion, the middle annular portion having a second thickness greater than the first thickness, such that a transition from a lop surface of the inner annular portion to a top surface of the middle annular portion defines a first step; an outer annular portion surrounding the middle annular portion, the outer annular portion having a third thickness greater than the second thickness, such that a transition from the top surface of the middle annular portion to a top surface of the outer annular portion defines a second step.

In some implementations, the top surface of the inner annular portion is configured to support the substrate from an edge region of the substrate during transport of the substrate; wherein the first step defines an interior-facing wall that provides lateral confinement of the substrate when the substrate is supported by the carrier ring.

In some implementations, the top surface of the middle annular portion is configured to be approximately aligned with a top surface of the substrate when present during processing in the process tool; wherein a process extension region is defined over the top surface of the middle annular portion during processing of the substrate in the process tool.

In some implementations, the outer annular portion defines a ring wall that prevents back diffusion of parasitic plasma from a surrounding region of the pedestal during processing of the substrate in the process tool.

In some implementations, a plasma exclusion region is defined over the top surface of the outer annular portion during processing in the process tool.

In some implementations, bottom surfaces of the inner, middle, and outer annular portions are substantially parallel with one another.

In some implementations, the first thickness is in the range of approximately 1 to 3 millimeters (mm); wherein the second thickness is in the range of approximately 2 to 6 mm; wherein the third thickness is in the range of approximately 7 to 13 mm.

In some implementations, the inner annular portion has a radial width that extends radially between an inner diameter of the carrier ring and the middle annular portion, the radial width of the inner annular portion being in the range of approximately 10 to 25 mm; wherein the middle annular portion has a radial width that extends radially between the inner annular portion and the outer annular portion, the radial width of the middle annular portion being in the range of approximately 5 to 20 mm; wherein the outer annular portion has a radial width dial extends radially between the middle annular portion and an outer diameter of the carrier ring, the radial width of the outer annular portion being in the range of approximately 5 to 20 mm.

In some implementations, the carrier ring is defined from a ceramic material.

In some implementations, the carrier ring has an integrated structure defined from a single piece of the ceramic material.

In some implementations, the carrier ring has a multi-part structure defined by multiple pieces of the ceramic material that are joined together.

In some implementations, a carrier ring configured to support a substrate during transport to or from a pedestal of a process tool and surrounding the substrate during processing, the carrier ring defined by, an annular structure having an inner diameter and an outer diameter, the annular structure having a bottom surface that is substantially coplanar, and a top surface including a plurality of annular tiers; wherein the annular tiers include, a first annular tier extending from the inner diameter of the annular structure to a first intermediate diameter greater than the inner diameter, the first annular tier having a first height above the bottom surface, the first annular tier defined to be adjacent a substrate support region of the pedestal that is configured to receive the substrate during processing, a second annular tier extending from the first intermediate diameter to a second intermediate diameter that is greater than the first intermediate diameter and less than the outer diameter of the annular structure, the second annular tier having a second height above the bottom surface, the second height being greater than the first height, and a third annular tier extending from the second intermediate diameter to the outer diameter of the annular structure, the third annular tier having a third height above the bottom surface, the third height being greater than the second height.

In some implementations, the first annular tier is configured to support the substrate from an edge region of the substrate during transport of the substrate; wherein a transition from the first annular tier to the second annular tier defines an interior-facing wall that provides lateral confinement of the substrate when the substrate is supported by the carrier ring.

In some implementations, the second annular tier is configured to be approximately aligned with a top surface of the substrate when present during processing in the process tool; wherein a process extension region is defined over the second annular tier during processing of the substrate in the process tool.

In some implementations, the third annular tier defines a ring wall that prevents back diffusion of parasitic plasma from a surrounding region of the pedestal during processing of the substrate in the process tool.

In some implementations, a plasma exclusion region is defined over the third annular tier during processing in the process tool.

In some implementations, the first height is in the range of approximately 1 to 3 mm; wherein the second height is in the range of approximately 2 to 6 mm; wherein the third height is in the range of approximately 7 to 13 mm;

In some implementations, a radial width of the first annular tier defined between the inner diameter of the annular structure and the first intermediate diameter is in the range of approximately 10 to 25 mm; wherein a radial width of the second annular tier defined between the first intermediate diameter and the second intermediate diameter is in the range of approximately 5 to 20 mm; wherein a radial width of the third annular tier defined between the second intermediate diameter and the outer diameter of the annular structure is in the range of approximately 5 to 20 mm.

In some implementations, the carrier ring is defined from a ceramic material.

BRIEF DESCRIPTION OF THE DRAWINGS

FIG. 4A illustrates a top view of a pedestal and the arms of spider forks, in accordance with one embodiment.

FIG. 4B illustrates a magnification cross-section of the pedestal edge, in accordance with one embodiment.

FIG. 4C illustrates a three-dimensional view of a pedestal sitting over a center column and connected to a base, which is configured to be connected to the lower chamber portion, in accordance with one embodiment.

FIG. 3 illustrates a perspective view of a pedestal, in accordance with implementations of the disclosure.

DETAILED DESCRIPTION

Figure 1:
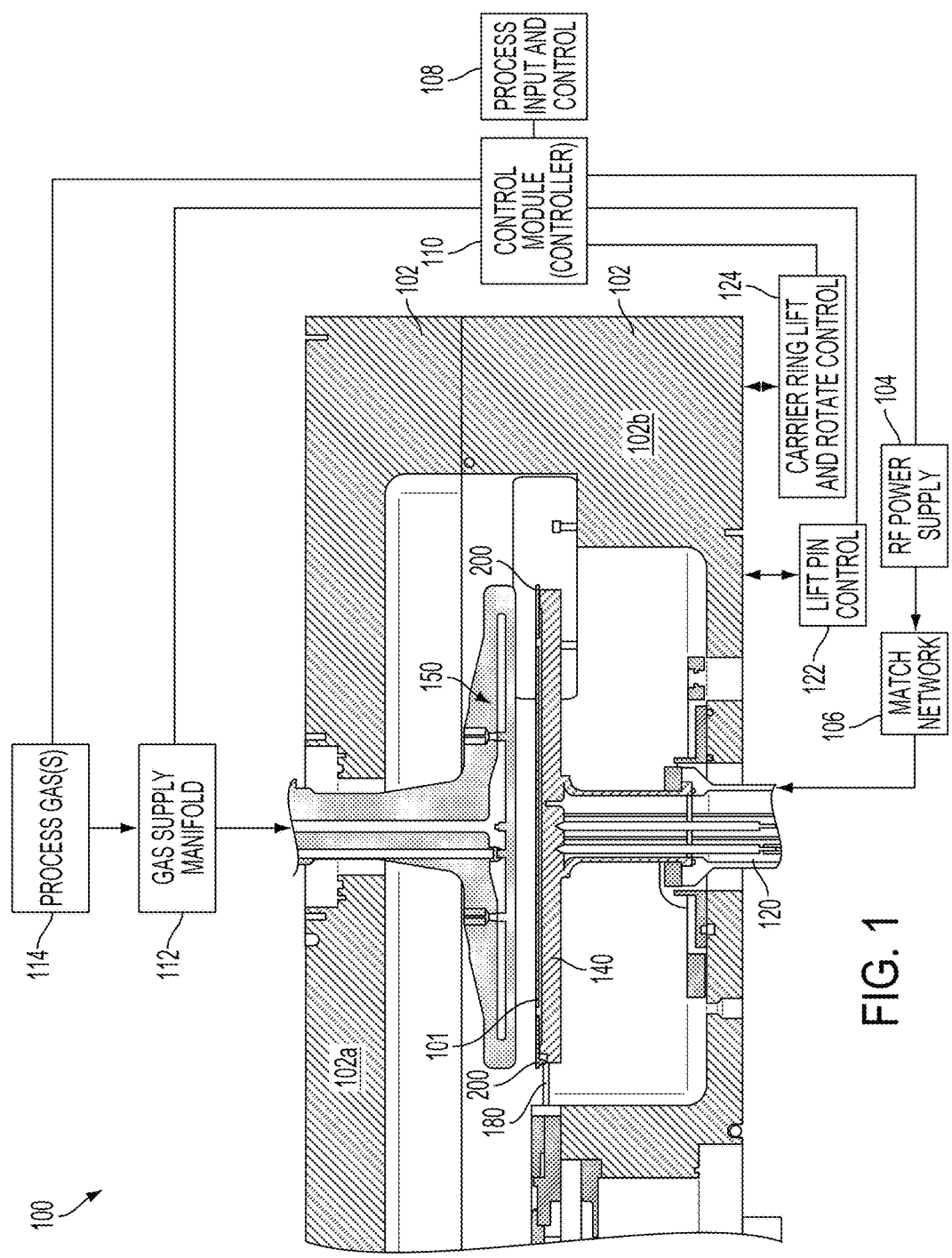
FIG. 1 illustrates a substrate processing system, which is used to process a wafer, e.g., to form films thereon.

Embodiments of the disclosure provide embodiments of a carrier ring used in deposition chambers for processing semiconductor wafers. Such a carrier ring can include a ring wall that prevents back diffusion of parasitic plasma, thereby reducing azimuthal non-uniformity at the edge region of the substrate.

In accordance with implementations of the disclosure, the carrier ring can be lifted from an under surface using spider forks having a pair of aims or other lifting mechanisms. When the carrier ring is lifted the carrier ring is raised to a point where contact support structures disposed on the carrier ring come into physical contact with the under surface of the wafer, thus lifting the wafer together with the carrier ring. The spider forks can then move the wafer to another station, wherein the carrier ring and wafer are lowered onto another pedestal.

In one configuration, a chamber includes multiple stations, e.g., such as four stations. The chamber then will include four spider forks and a carrier ring will be disposed around respective pedestals of each of the stations. In this configuration, the spider forks can simultaneously lift each of the four carrier rings (and any wafer disposed thereon), and rotate all of the carrier rings and wafers to the next station (e.g., for additional or different processing). In one configuration, the chamber has loading and unloading stations when one wafer is loaded at a time or can include parallel loading and unloading stations where two wafers are loaded and unloaded at a time.

It should be appreciated that the present embodiments can be implemented in numerous ways, such as a process, an apparatus, a system, a device, or a method. Several embodiments are described below.

Deposition of films is preferably implemented in a plasma enhanced chemical vapor deposition (PECVD) system. The PECVD system may lake many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

One example of a multi-station PECVD tool is the STRATA3 tool, manufactured by Lam Research Corporation, which employs ceramic pedestals having cutouts to accommodate spindle forks. When utilized for oxide/nitride (ON) stack deposition, for example, deposition uniformity may be impacted due to the non-circular design of the pedestal. The cutouts generate azimuthally non-uniform impedance and maintain azimuthally non-uniform parasitic plasma around the pedestal. Parasitic plasma around the pedestal interacts with primary plasma between the showerhead and wafer, and modulates film uniformity. The impact of azimuthally non-uniform plasma causes increased deposition thickness at the wafer edge in the regions of the cutouts. As a result, azimuthal uniformity of the deposition film is degraded.

However, implementations of the present disclosure improve azimuthal uniformity through the reduction of back-diffusion of reactive species and suppression of local parasitic plasmas. The cross-talk between the primary plasma and parasitic plasma around the pedestal is suppressed by a ring wall structure introduced on, or as part of, the carrier ring. The ring wall structure reduces or eliminates the azimuthal non-uniformity in the deposition profile.

FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101. As mentioned above, one example of films that can be formed over the wafer 101 is an oxide/nitride stack.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the showerhead 150 and distributed in a space volume defined between the showerhead 150 face that faces that wafer 101 and the wafer 101 resting over the pedestal 140.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider/spindle forks 180. The carrier ring 200 is therefore lifted along with the wafer 101 and can be rotated to another station, e.g., in a multi-station system.

Figure 2:
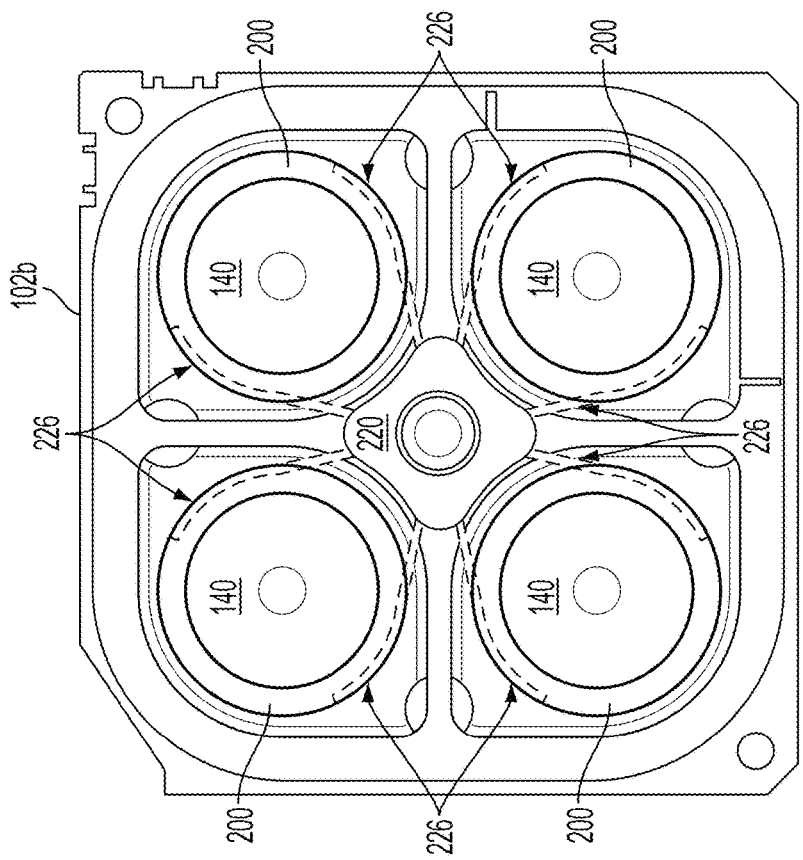
FIG. 2 illustrates a top view of a multi-station processing tool, wherein four processing stations are provided, in accordance with one embodiment.

FIG. 2 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
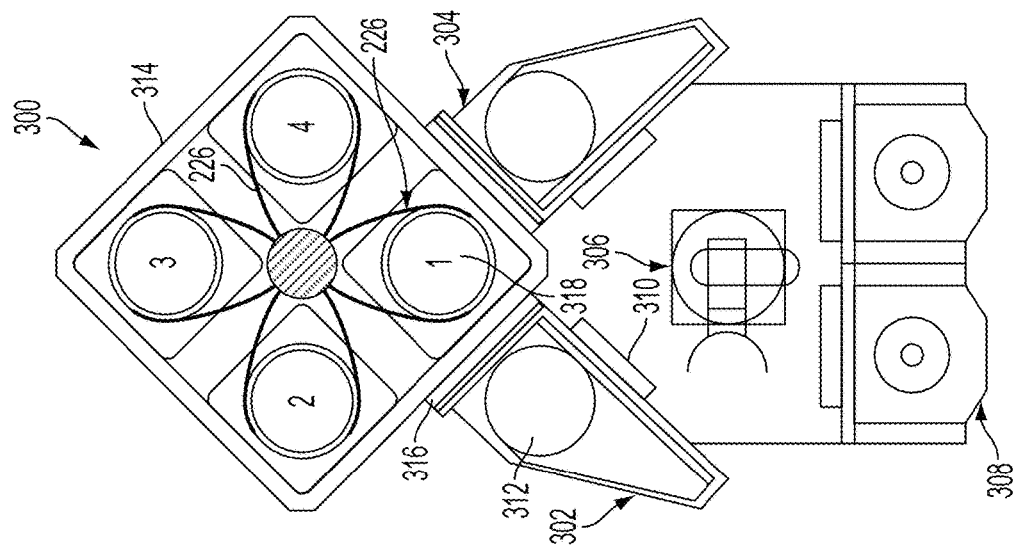
FIG. 3 shows a schematic view of an embodiment of a multi-station processing tool with an inbound load lock and an outbound load lock, in accordance with one embodiment.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider folks 226 for transferring substrates within processing chamber 102b. As will be described in more detail below, the spider forks 226 rotate and enable transfer of wafers from one station to another. The transfer occurs by enabling the spider forks 226 to lift carrier rings 200 front an outer undersurface, which lifts the wafer, and rotates the wafer and carrier together to the next station. In one configuration, the spider forks 226 are made from a ceramic material to withstand high levels of heat during processing.

FIG. 4A illustrates a top view 400 of the pedestal 140 and the arms of spider forks 126. A dash-line illustrates the location of the carrier ring 200, when it sits over the pedestal 140 as an annular ring, around the periphery of the pedestal. Each arm is configured to sit at opposite side regions of the pedestal 140 side body, wherein the pedestal 140 side body has recessed regions (cutouts) to enable the arms of the spider forks 126 to sit. This orientation allows for the carrier ring 200 to be placed over the pedestal 140 and for the arms of the spider forks 126 to sit under the carrier ring 200, when placed thereon. In this example illustration, the pedestal 140 has a wafer support region 140a, a carrier support surface 140b, and an engagement step 140c, as shown in FIG. 4B. The carrier support surface 140b resides at a step below the wafer support region 140a surface. This allows for the carrier support surface 140b to receive the carrier ring 200, and such that the carrier ring 200 is held in place by extensions of the carrier ring 200 filling into the engagement locations 410.

The carrier support surface 140a is shaped as an annular disk surface that surrounds the wafer support region 140a at a lower step level. The arms of the spider forks 126 will generally reside just under the level of the carrier support surface 140b when in a non-engaged state (i.e., the spider forks are not in physical contact with the underside of the carrier ring 200). When the arms of the spider fork 126 are in an engaged state, the arms are raised so that contact is made by the first and second arms of the spider forks 126 with an underside of the carrier ring 200. This allows the carrier ring 200 to be lifted by the arms of the spider forks 126 and then moved, e.g., rotated to another station by mechanism 220.

FIG. 4C illustrates a three-dimensional view 402 of the pedestal 140 sitting over a center column and connected to a base 404, which is configured to be connected to the lower chamber portion 102b. Thus view shows how the carrier ring 200 is placed over the carrier support surface 140b and overhangs the side recessed regions (cutouts) 420 of the pedestal 140, as shown in FIG. 4A.

The carrier ring 200 includes a plurality of extensions which secure the carrier ring 200 to prevent the carrier ring 200 from shifting during processing. The extensions are configured to sit in the engagement locations 410, as shown in FIG. 4A.

In one embodiment, the carrier ring 200 will sit over a plurality of contact supports located on the carrier support region 140b to enable precision placement in contact over the carrier support region 140b. The carrier ring 200 is a disk that has an outer radius that begins at the outer edge side 244 and extends to the inner radius that is located at the wafer edge side 240. In this illustration, the top surface of the wafer 101 is approximately at the level of the top surface 246 of the carrier ring 200. At the wafer edge side 240, the carrier ring 200 will include contact support structures that are placed at a height that is lower than the top carrier ring surface 246 so that the contact support structures can be located below the wafer 101, which is configured to overhang the wafer support region 140a. In this manner, when the carrier ring 200 is lifted, the contact support structures at the tip of the carrier ring 200 at the wafer edge side 240, can lift the wafer 101 together with the lifting of the carrier ring 200.

Thus the carrier ring 200 may sit at a spaced apart orientation from the carrier support region 140b, due to the contact support structures that are formed on the carrier support region 140b to enable precision contact with the bottom surface of the carrier ring 200. Additional contact support structures are provided over the wafer support region 140a, which define a slight separation between the bottom surface of the wafer 101 and the wafer support region 140a. The contact support structures are minimal contact areas (MCAs), which are used to enhance the precision (e.g., with higher tolerances) contact of the bottom of the wafer with the wafer support region 140a. In some embodiments, the contact support structures may be referred to as bumps with rounded or soft edge surfaces.

MCAs are used to improve precision mating between surfaces when high precision or tolerances are required. In the context of the present embodiments, precision is required so that the carrier ring 200 making contact with the underside of the wafer will make precision contact with each of the contact support structures. As mentioned above, other areas in the system can utilize MCA's, such as over the carrier support surface 140b, and over the wafer support region 140a of the pedestal 140. For this reason, a space may exist between the carrier ring 200 and the carrier support surface 140b and a space may exist between the wafer 101 and the wafer support region 140a (e.g., by one or more MCAs distributed thereon).

Figure 5:
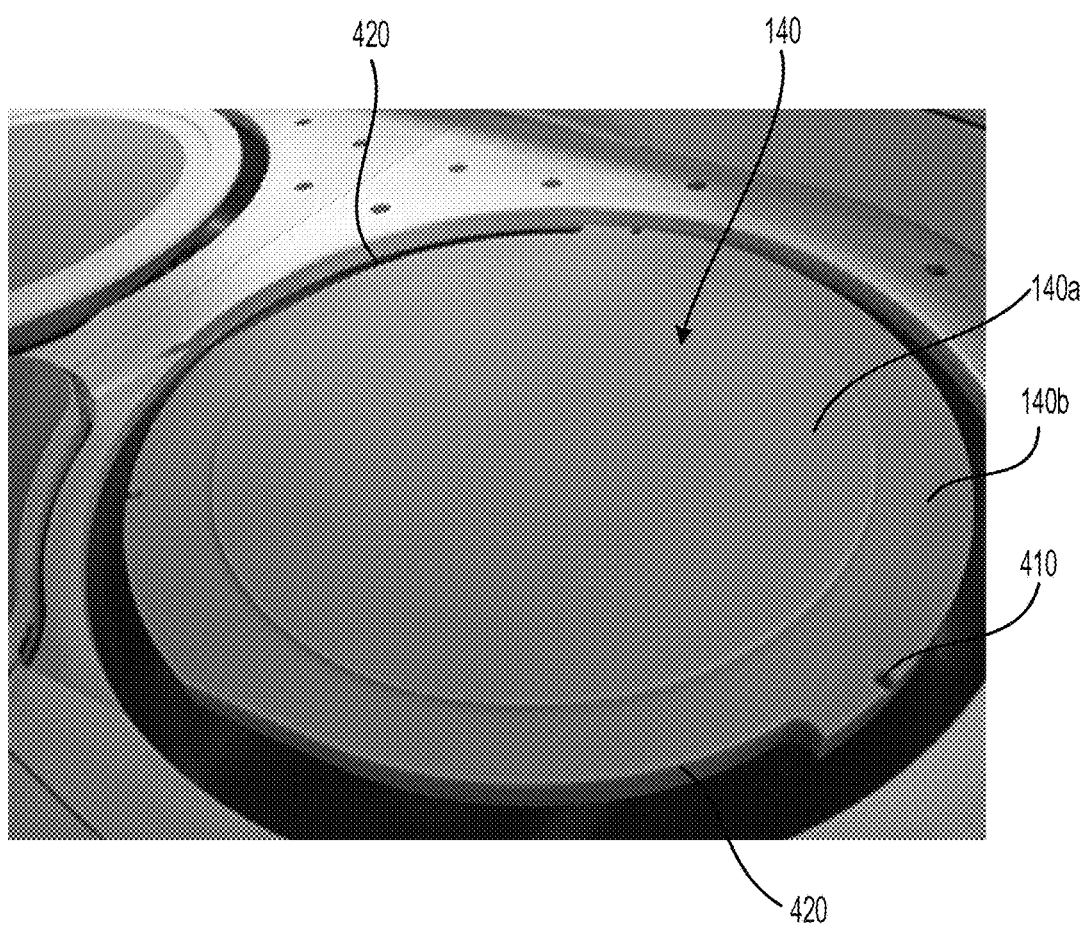

FIG. 5 illustrates a perspective view of the pedestal 140, in accordance with implementations of the disclosure. The substrate support region 140a is configured to receive the substrate for processing. The carrier support region 140b surrounds the substrate support region 140a, and is situated at a step down from the substrate support region. Clearly shown are the recessed regions 420 of the pedestal 140, which are cutouts from the otherwise circular form of the pedestal. The cutouts are provided to accommodate the spindle forks so that they may be positioned beneath the carrier ring 200 to be able to support the carrier ring. However, the cutouts result in a circumferentially inconsistent structure of the pedestal, as the radial extent of the pedestal (in particular, the carrier support region of the pedestal) is reduced in the regions of the cutouts as compared to the remainder of the pedestal.

Figure 6:
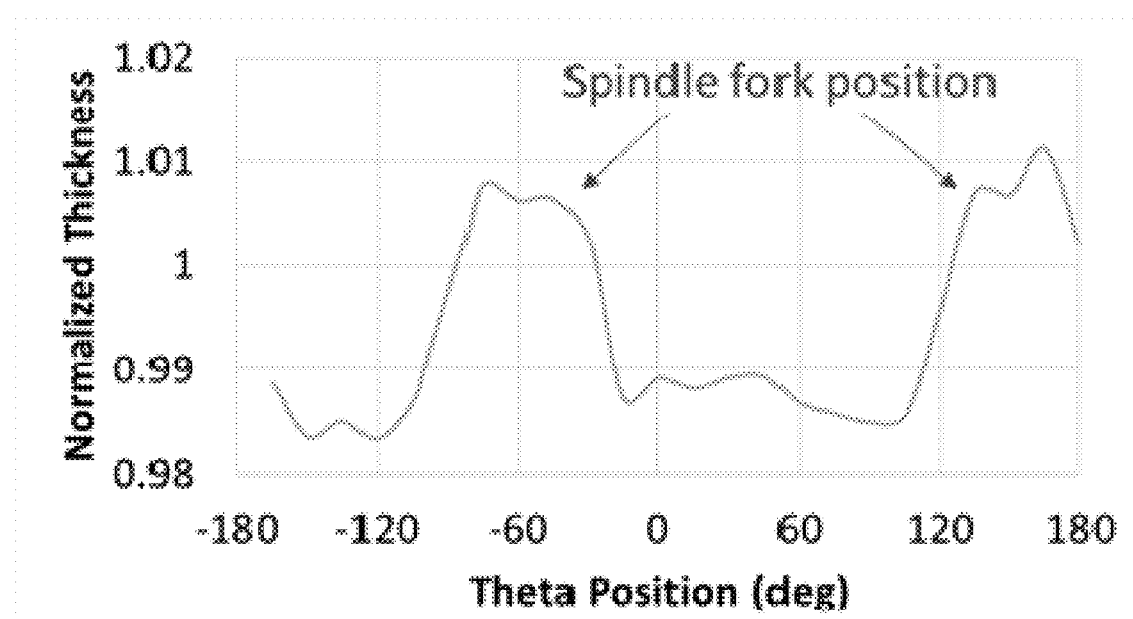
FIG. 6 illustrates a graph showing an azimuthal profile at a 1.8 mm edge exclusion region of a substrate following a PECVD deposition operation, in accordance with implementations of the disclosure.

The effects of this non-circular pedestal are shown with reference to FIG. 6, which is a graph illustrating an azimuthal profile at a 1.8 mm edge exclusion region of a substrate following a deposition operation. The graph shows normalized thickness of the deposited film versus angular position, with zero degrees being the location of the wafer notch. As can be seen, at angular locations corresponding to the spindle fork positions (i.e. where the recessed regions of the pedestal are present) film thickness is greater than for other locations, causing a double-hump pattern in the deposition profile. This is believed to be caused by the generation and maintenance of azimuthally non-uniform plasma during plasma processing due to the non-circular form of the pedestal. The double-humps are not suppressed by existing confinement rings because long-lived reactive species can diffuse through narrow channels of the rings.

Figure 7:
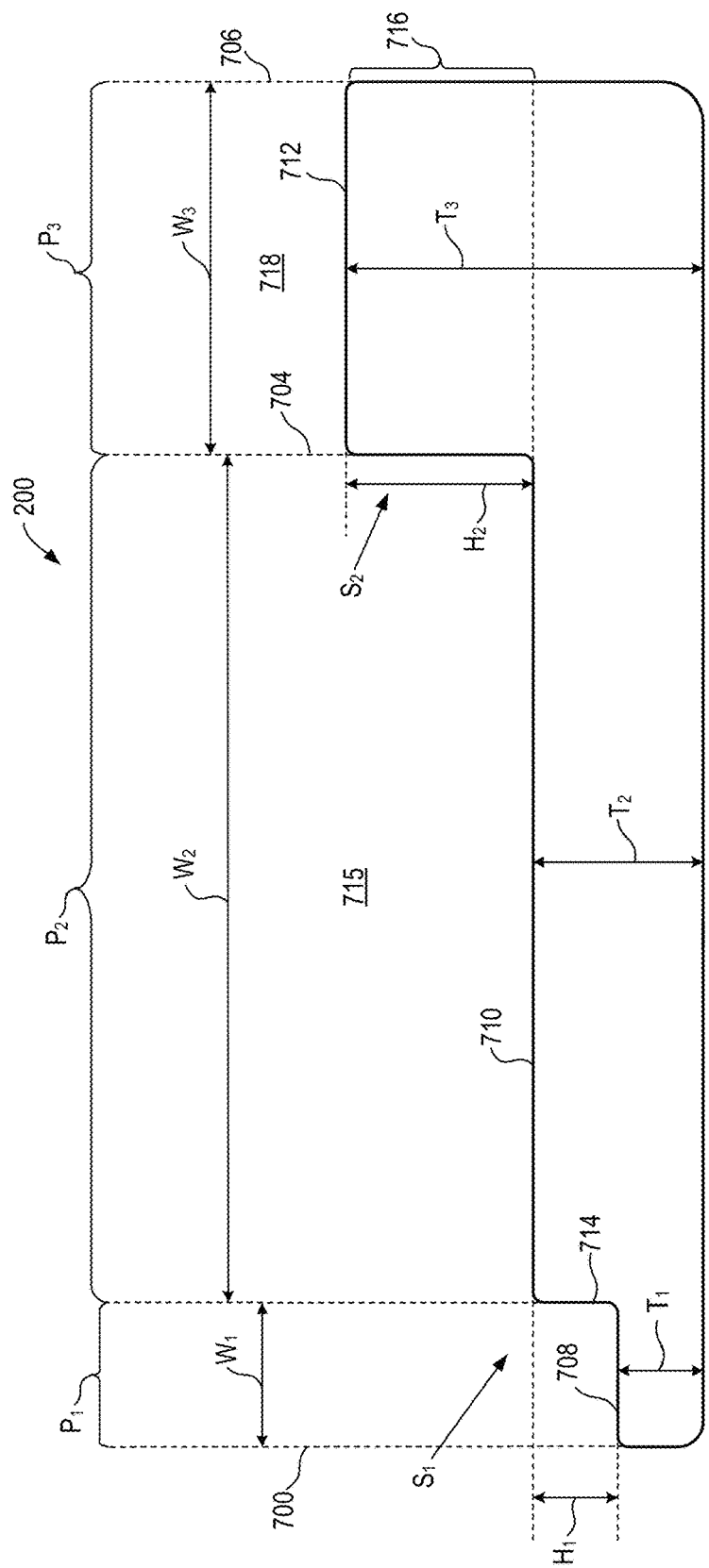
FIG. 7 illustrates a cross section of a carrier ring, in accordance with implementations of the disclosure.

FIG. 7 illustrates a crass section of a carrier ring, in accordance with implementations of the disclosure. The illustrated carrier ring is configured to improve azimuthal uniformity using an extended wall feature. In the illustrated implementation, the carrier ring 200 includes a portion $P_1$ that is an inner annular portion of the carrier ring 200, a portion $P_2$ that is a middle annular portion of the carrier ring 200, and a portion $P_3$ that is an outer annular portion of the carrier ring 200.

The inner annular portion $P_1$ is defined to be adjacent the substrate support region of the pedestal when the carrier ring is disposed on the pedestal for substrate processing operations. The inner annular portion $P_1$ has a thickness $T_1$. The inner annular portion $P_1$ extends from an inner diameter (ref. 700) of the carrier ring to a first intermediate diameter (ref. 702), defining a width $W_1$.

The middle annular portion $P_2$ surrounds the inner annular portion $P_1$, and has a thickness $T_2$ that is greater than the thickness $T_1$. The middle annular portion $P_2$ extends from the first intermediate diameter (ref. 702) to a second intermediate diameter (ref. 704), defining a width $W_2$. The transition from the top surface 708 of the inner annular portion $P_1$ to the top surface 710 of the middle annular portion $P_2$ defines a first step $S_1$. A height $H_1$ of the first step $S_1$ is equal to the difference between $T_1$ and $T_2$.

The outer annular portion $P_3$ surrounds the middle annular portion $P_2$, and has a thickness $T_3$ that is greater than the thickness $T_2$. The outer annular portion $P_3$ extends from the second intermediate diameter (ref. 704) to an outer diameter (ref. 706) of the carrier ring, defining a width $W_1$. The transition from the top surface 710 of the middle annular portion $P_2$ to the top surface 712 of the outer annular portion $P_3$ defines a second step $S_2$. A height $H_2$ of the second step $S_2$ is equal to the difference between $T_2$ and $T_3$.

The top surfaces of the inner, middle and outer annular portions respectively define a series of inner, middle, and outer annular tiers that are separated by steps.

The top surface 708 (inner annular tier) of the inner annular portion $P_1$ is configured to support the substrate from an edge region of the substrate during transport of the substrate. The first step defines an interior-facing wall 714 that provides lateral confinement of the substrate when the substrate is supported by the carrier ring 200.

The top surface 710 (middle annular tier) of the middle annular portion $P_2$ is configured to be approximately aligned with a top surface of the substrate when present during processing in the process tool. A process extension region 715 is defined over the top surface 710 of the middle annular portion $P_2$ during processing of the substrate in the process tool.

The outer annular portion $P_3$ defines a ring wall that prevents back diffusion of parasitic plasma from a surrounding region of the pedestal during processing of the substrate in the process tool. More specifically, the ring wall is defined as that portion of the outer annular portion $P_3$ that extends above the level of the top surface 710 (having the height $H_2$). A plasma exclusion region 718 is defined over the top surface 712 (outer annular tier) of the outer annular portion $P_3$ during processing in the process tool.

The ring wall has two functions: reducing back-diffusion of neutral radicals (and charged particles), and suppressing local ignition of plasma between the ring and showerhead. The former is achieved by generating a recirculation zone outside of the ring wall and quenching of radicals on the external surface of the wall. The latter is achieved by narrowing the gap between the showerhead and the carrier ring so that plasma cannot be formed. The combination of these functions ensures that cross-talk between the parasitic plasma and the primary plasma is eliminated. This removes the footprint of azimuthally non-uniform plasma from the deposition profile, thus improving overall uniformity. Since the edge ring wall is separately defined from the pedestal, its dimensions can be easily changed and optimized for each process and tool.

In the illustrated implementation, the bottom surfaces of the inner, middle, and outer annular portions are substantially parallel with one another.

In some implementations, the carrier ring 200 is designed for use with a 300 mm wafer. As such, the dimensions provided herein should be viewed as scalable to other size wafers, either smaller, e.g., 200 mm, or larger, e.g., 450 mm. Further, the dimensions provided herein should be understood to be adjustable within a tolerance, e.g., up to or about +/−10% or some reduced or increased tolerance that is deemed applicable to the environment in which the carrier ring 200 is used and the tools and process parameters likely to be used when implementing the carrier ring 200. With this understanding in place, the following dimensions should be viewed as examples for a 300 mm substrate size, and not limiting on any specific configuration.

In some implementations, the thickness $T_1$ of the inner annular portion $P_1$ is in the range of approximately 0.5 to 5 millimeters (mm), or more specifically in the range of approximately 1 to 3 mm, or even more specifically in the range of approximately 1 to 2 mm. In some implementations, the thickness $T_2$ of the middle annular portion $P_2$ is in the range of approximately 1 to 8 mm, or more specifically in the range of approximately 2 to 6 mm, or even more specifically in the range of approximately 3 to 5 mm. In some implementations, the thickness $T_3$ of the outer annular portion $P_3$ is in the range of approximately 5 to 15 mm, or more specifically in the range of approximately 7 to 13 mm, or even more specifically in the range of approximately 8 to 10 mm.

In some implementations, the inner annular portion $P_1$ has a radial width $W_1$ that extends radially between the inner diameter 700 of the carrier ring and the middle annular portion $P_2$, with the radial width $W_1$ of the inner annular portion $P_1$ being in the range of approximately 0 to 30 mm, or more specifically in the range of approximately 10 to 25 mm, or even more specifically in the range of approximately 15 to 20 mm, in accordance with various implementations of the disclosure. In some implementations, the middle annular portion $P_2$ has a radial width $W_2$ that extends radially between the inner annular portion $P_1$ and the outer annular portion $P_3$, the radial width $W_2$ of the middle annular portion $P_2$ being in the range of approximately 0 to 30 mm, or more specifically in the range of approximately 5 to 20 mm, or even more specifically in the range of approximately 10 to 15 mm. In some implementations, the outer annular portion $P_3$ has a radial width $W_3$ that extends radially between the middle annular portion $P_2$ and the outer diameter 706 of the carrier ring, the radial width $W_3$ of the outer annular portion $P_3$ being in the range of approximately 0 to 30 mm, or more specifically in the range of approximately 5 to 20 mm, or even more specifically in the range of approximately 10 to 15 mm.

In some implementations, the carrier ring is defined from a ceramic material. In some implementations, the carrier ring has an integrated structure defined from a single piece of the ceramic material. Whereas in other implementations, the carrier ring has a multi-part structure defined by multiple pieces of the ceramic material that are joined together.

Figure 8:
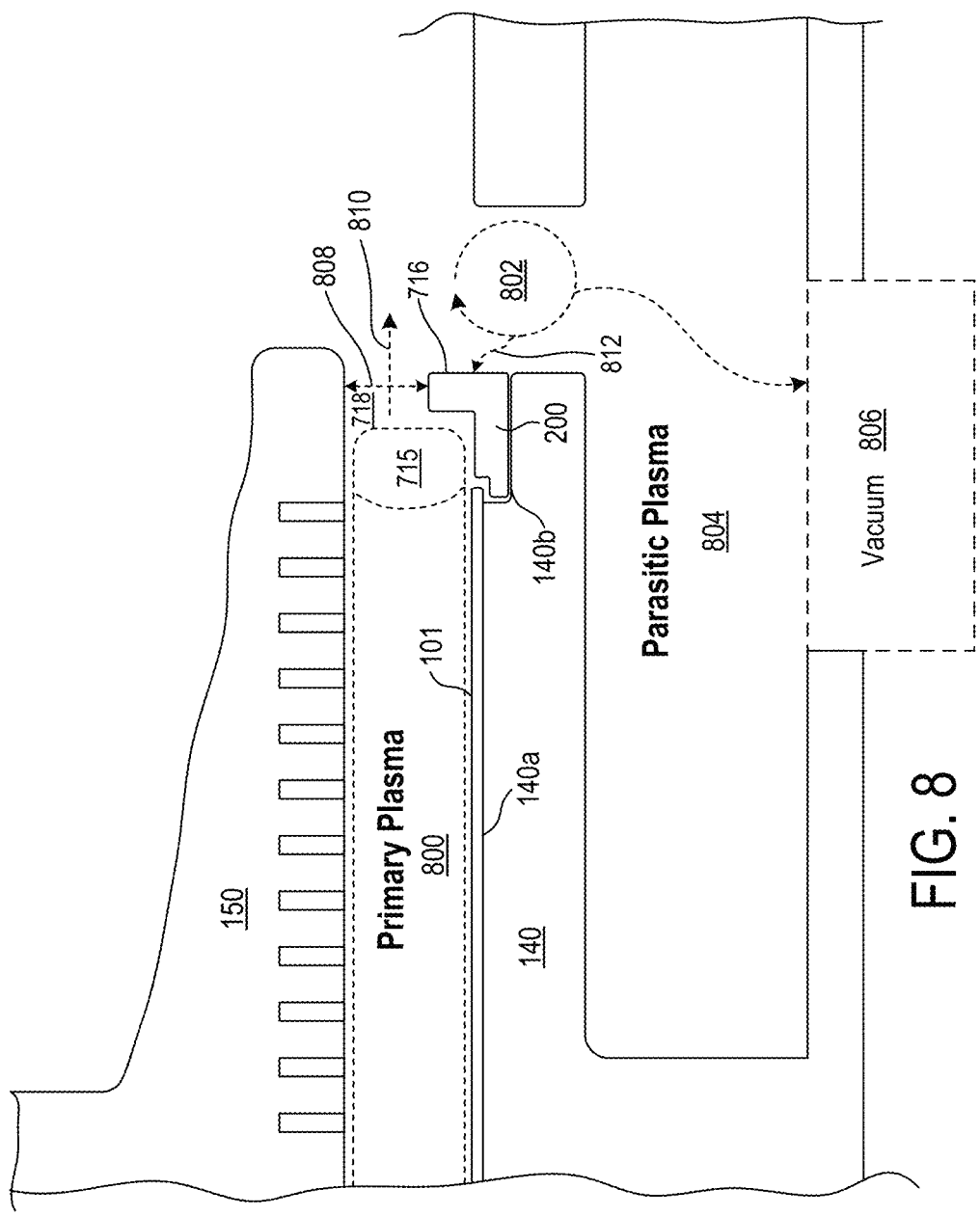
FIG. 8 illustrates a cross section of a portion of a process chamber, in accordance with implementations of the disclosure.

FIG. 8 illustrates a cross section of a portion of a process chamber, in accordance with implementations of the disclosure. The substrate 101 is disposed on the substrate support region 140a of the pedestal 140, while the carrier ring 200 is disposed on the carrier support surface 140b of the pedestal 140. The showerhead 150 is shown in a lowered position for processing of the substrate 101. During performance of the process operation, a primary plasma 800 is formed between the showerhead and the exposed surface of the substrate 101. A process extension 715 is defined over the middle annular portion of the carrier ring 200. A plasma exclusion region 718 is defined between the outer annular portion (including the ring wall 716) of the carrier ring 200 and the showerhead 150. The distance (ref. 808) between the top surface 712 of the outer annular portion and the showerhead 150 is in the range of approximately 4 to 20 mm, or more specifically in the range of approximately 6 to 13 mm, or even more specifically in the range of approximately 8 to 11 mm, in accordance with implementations of the disclosure.

The ring wall 716 reduces back-diffusion of neutral radicals (and charged particles), and suppresses local ignition of plasma between the ring and showerhead. Bulk flow of gas occurs in a radially outward direction, as indicated by ref. 810, and is guided downwards below the pedestal 140 by a vacuum source 806. The ring wall reduces back-diffusion of neutral radicals and charged particles, by generating a recirculation zone 802 outside of the ring wall and quenching of radicals on the external surface of the wall (shown at ref 812). The ring wall further suppresses local ignition of plasma between the ring and showerhead by narrowing the gap (ref. 808) between the showerhead and the carrier ring so that plasma cannot be formed. The combination of these functions ensures that cross-talk between the parasitic plasma 804 formed around the pedestal 140 and the primary plasma 800 is eliminated. This removes the footprint of azimuthally non-uniform plasma from the deposition profile, thus improving overall uniformity.

Figure 9:
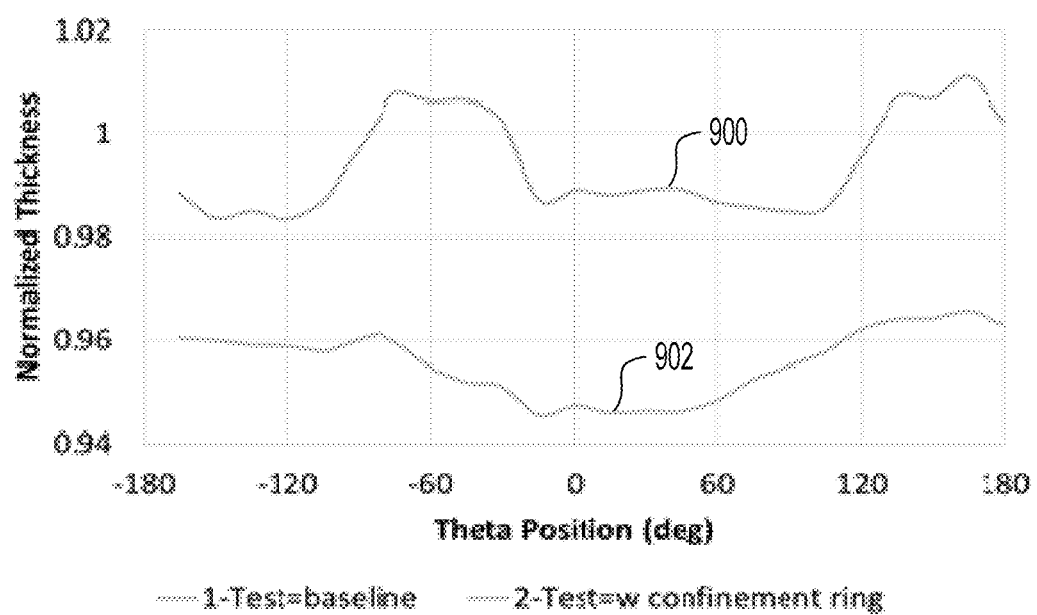
FIG. 9 is a graph showing the azimuthal profile for a PECVD deposition process, illustrating normalized thickness versus angular position at a 1.8 mm edge exclusion region of a substrate, in accordance with implementations of the disclosure.

FIG. 9 is a graph showing the azimuthal profile for a PECVD deposition process, illustrating normalized thickness versus angular position at a 1.8 mm edge exclusion region of a substrate, in accordance with implementations of the disclosure. The curve 900 shows the normalized thickness for a PECVD deposition process utilizing a standard carrier ring without a ring wall. The curve 902 shows the normalized thickness for the same deposition process, but utilizing a carrier ring including a ring wall as described above. As can be seen from the curve 900, without the ring wall, azimuthal uniformity is negatively impacted, as the deposition profile exhibits a double-hump shape due to the recessed regions of the pedestal. However, with the ring wall as shown by the curve 902, azimuthal uniformity is dramatically improved.

Figure 10:
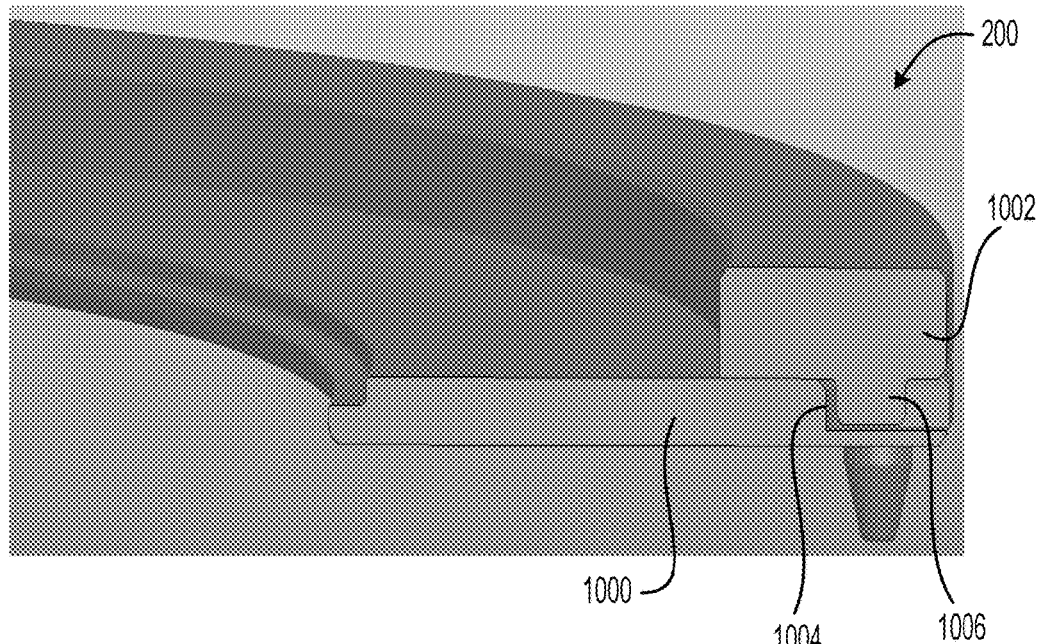
FIG. 10 illustrates a perspective cutaway view of a carrier ring, in accordance with implementations of the disclosure.

FIG. 10 illustrates a perspective cutaway view of a carrier ring, in accordance with implementations of the disclosure. The carrier ring 200 includes a base ring 1000 and an edge ring 1002. The edge ring 1002 is configured to be seated on the base ring 1000 over the outer region of the base ring 1000. To facilitate proper alignment of the edge ring 1002 over the base ring 1000, the edge ring 1002 can include one or more protrusions 1006 which extend downward, and are configured to fit into one or more respective recesses 1004 defined on the base ring 1000. When coupled together, the base ring 1000 and the edge ring 1002 together define the structure of carrier ring 200, so as to include the aforementioned inner, middle, and outer annular portions. In this configuration, since the edge ring 1002 is a separate part from the base ring 1000, the dimensions of the carrier ring can be easily changed and optimized for each process and tool. In particular, the radial width of the edge ring 1002 can be varied to thereby vary the radial width of the outer annular portion. And the height (or thickness) of the edge ring 1002 can be varied to thereby vary the height (or thickness) of the outer annular portion and/or the ring wall thereby defined.

Figure 11:
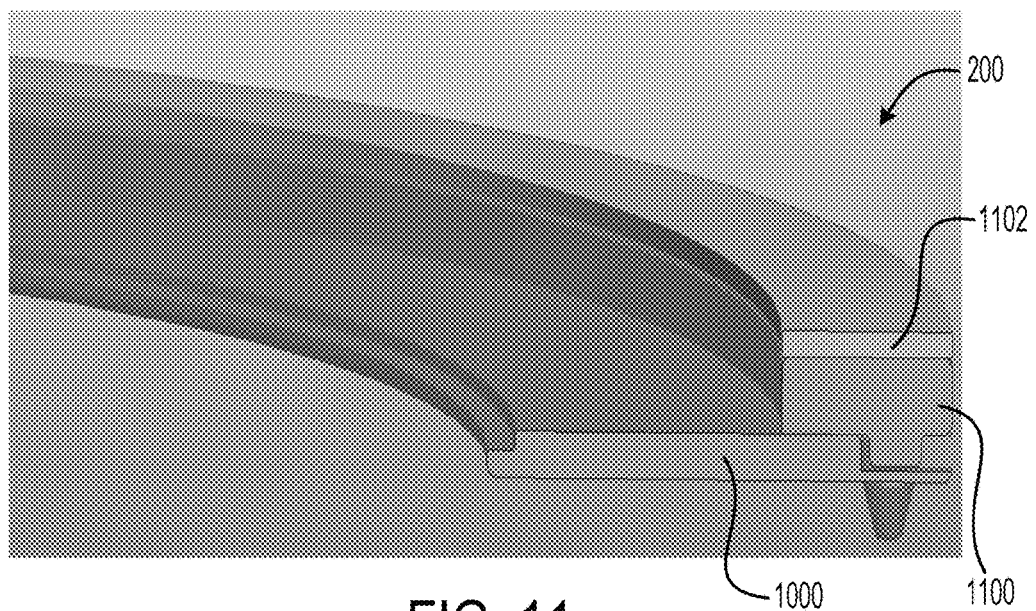
FIG. 11 illustrates a perspective cutaway view of a carrier ring, in accordance with implementations of the disclosure.

FIG. 11 illustrates a perspective cutaway view of a carrier ring, in accordance with implementations of the disclosure. In the illustrated implementation, the carrier ring includes a base ring 1000, a lower edge ring 1100 and an upper edge ring 1102. The lower edge ring 1100 is configured to be seated on the base ring 1000, and the upper edge ring 1102 is configured to be seated on the lower edge ring 1100. The upper edge ring 1102 can be added to the lower edge ring 1100 to provide adjustment of me height of the ring wall.

Figure 12:
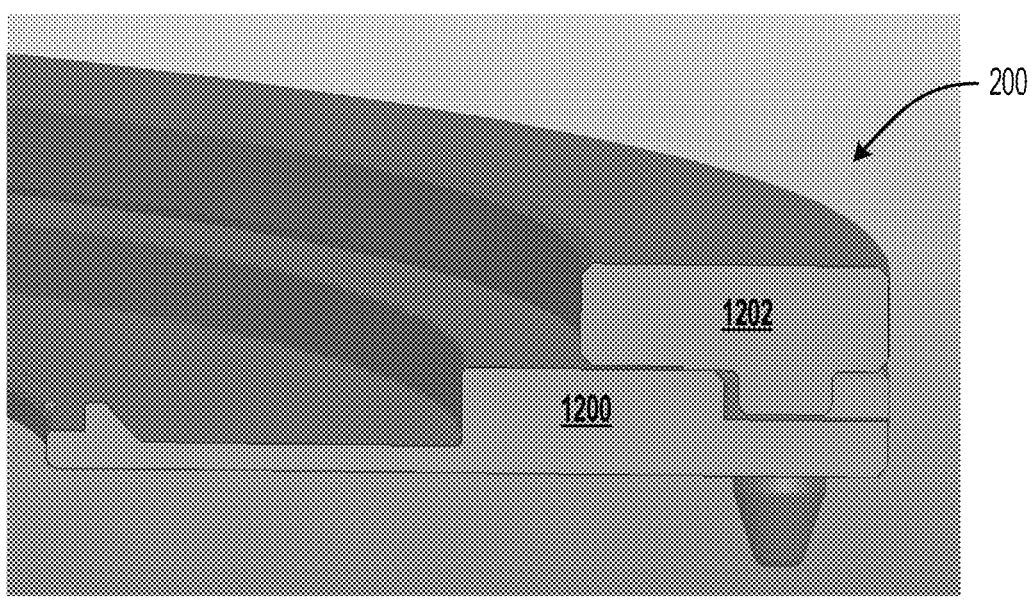
FIG. 12 illustrates a perspective cutaway view of a carrier ring, in accordance with implementations of the disclosure.

FIG. 12 illustrates a perspective cutaway view of a carrier ring, in accordance with implementations of the disclosure. In the illustrated implementation, the carrier ring 200 includes a base ring 1200 and an edge ring 1202, the edge ring being configured to be sealed over an outer region of the base ring. The base ring and edge ring are configured to reduce the weight of the carrier ring.

Implementations of the present disclosure combine plasma confinement with diffusion suppression to overcome the problem caused by asymmetric plasma and an asymmetric pedestal. This cannot be achieved by existing confinement rings. For instance, the use of plasma confinement rings (e.g. as described in U.S. Pat. No. 5,534,751) may reduce the cross talk of electrons and ions to isolate primary plasma and parasitic plasma. But existing confinement ring structures do not effectively attenuate neutral radicals with low recombination rates on surfaces. These long-lived neutral radicals can thus diffuse between the rings. In order to prevent back-diffusion by an existing confinement ring, the ring would need to be very wide in the radial direction. The resulting footprint of the tool would then be unacceptably large. In contrast to confinement rings, the edge ring wall described in accordance with implementations of the present disclosure suppresses back-diffusion of radicals by a physical wall and by creating a recirculation zone. This is important for optimizing processes that generate radicals with low recombination rates on surfaces.

Figure 13:
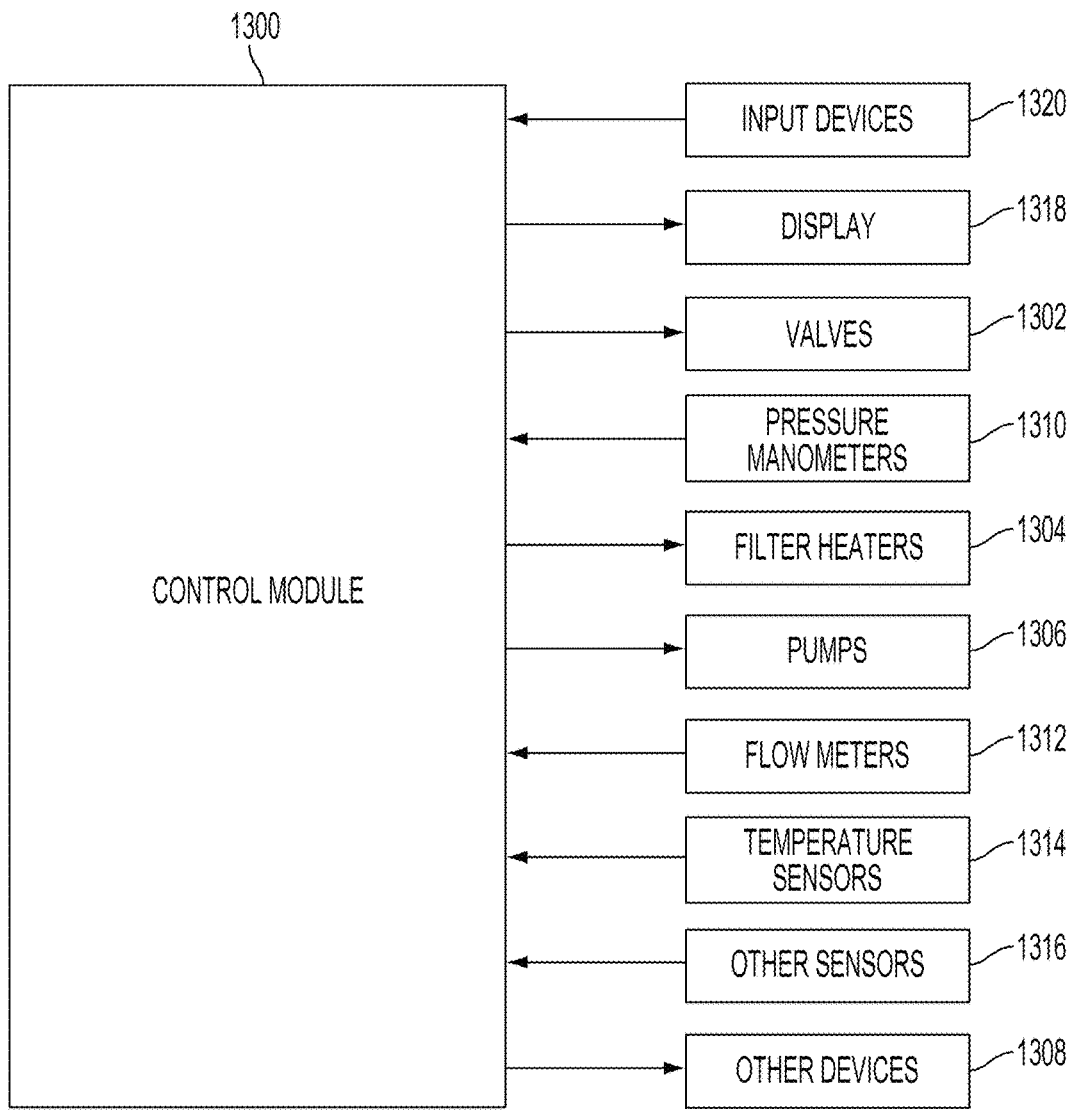
FIG. 13 shows a control module for controlling the systems, in accordance with one embodiment.

FIG. 13 shows a control module 1300 for controlling the systems described above. In one embodiment, the control module 110 of FIG. 1 may include some of the example components. For instance, the control module 1300 may include a processor, memory and one or more interfaces. The control module 1300 may be employed to control devices in the system based in part on sensed values. For example only, the control module 1300 may control one or more of valves 1302, filter heaters 1304, pumps 1306, and other devices 1308 based on the sensed values and other control parameters. The control module 1300 receives the sensed values from, for example only, pressure manometers 1310. Flow meters 1312, temperature sensors 1314, and/or other sensors 1316. The control module 1300 may also be employed to control process conditions during precursor delivery and deposition of the film. The control module 1300 will typically include one or more memory devices and one or more processors.

The control module 1300 may control activities of the precursor delivery system and deposition apparatus. The control module 1300 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 1300 may also monitor the pressure differential and automatically switch vapor precursor delivery from one or more paths to one or more other paths. Other computer programs stored on memory devices associated with the control module 1300 may be employed in some embodiments.

Typically there will be a user interface associated with the control module 1300. The user interface may include a display 1318 (e.g. a display screen and/or graphical software displays of the apparatus and/or process conditions), and user input devices 1320 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, tiller pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 1310, and thermocouples located in delivery system, the pedestal or chuck (e.g. the temperature sensors 1314). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A carrier ring configured to support a substrate during transport to or from a pedestal of a process tool and surrounding the substrate during processing, the carrier ring comprising, an inner annular portion having a first thickness, the inner annular portion defined to be adjacent a substrate support region of the pedestal that is configured to receive the substrate during processing;

a middle annular portion surrounding the inner annular portion, the middle annular portion having a second thickness greater than the first thickness, such that a transition from a top surface of the inner annular portion to a top surface of the middle annular portion defines a first step, wherein an inner diameter of the middle annular portion is greater than a diameter of the substrate;

an outer annular portion surrounding the middle annular portion, the outer annular portion having a third thickness greater than the second thickness, such that a transition from the top surface of the middle annular portion to a top surface of the outer annular portion defines a second step, wherein the third thickness is configured to establish a gap between the top surface of the outer annular portion and a showerhead of the process tool during processing, wherein the third thickness is configured to suppress local ignition of plasma in the gap to define a plasma exclusion region below a peripheral region of the showerhead and over the top surface of the outer annular portion, the plasma exclusion region surrounding a primary plasma region that is below a central region of the showerhead and over the substrate, the third thickness further being configured to establish a recirculation zone outside of the outer annular portion that causes quenching of radicals on an external surface of the outer annular portion;

wherein the top surface of the middle annular portion is configured to be approximately aligned with a top surface of the substrate when present during processing in the process tool when the carrier ring is supported by a carrier support surface surrounding the substrate support region, wherein when the carrier ring is supported by the carrier support surface, the carrier ring does not support the substrate;

wherein a process extension region is defined over the top surface of the middle annular portion during processing of the substrate in the process tool;

wherein the carrier ring includes a base ring and an edge ring, the base ring having one or more recesses, the edge ring having one or more protrusions that respectively fit in the one or more recesses.

2. The carrier ring of claim 1, wherein the top surface of the inner annular portion is configured to support the substrate from an edge region of the substrate during transport of the substrate;

wherein the first step defines an interior-facing wall that provides lateral confinement of the substrate when the substrate is supported by the carrier ring, wherein the interior-facing wall is defined at the inner diameter of the middle annular portion that is greater than the diameter of the substrate, such that a gap is formed between the interior-facing wall and an outer edge of the substrate when the substrate is supported by the top surface of the inner annular portion.

3. The carrier ring of claim 1, wherein the outer annular portion defines a ring wall that prevents back diffusion of parasitic plasma from a surrounding region of the pedestal during processing of the substrate in the process tool.

4. The carrier ring of claim 1, wherein bottom surfaces of the inner, middle, and outer annular portions are substantially parallel with one another.

5. The carrier ring of claim 1, wherein the first thickness is in the range of approximately 1 to 3 millimeters (mm);

wherein the second thickness is in the range of approximately 2 to 6 mm, provided the second thickness is greater than the first thickness;

wherein the third thickness is in the range of approximately 7 to 13 mm.

6. The carrier ring of claim 1,
wherein the inner annular portion has a radial width that extends radially between an inner diameter of the carrier ring and the middle annular portion, the radial width of the inner annular portion being in the range of approximately 10 to 25 mm;
wherein the middle annular portion has a radial width that extends radially between the inner annular portion and the outer annular portion, the radial width of the middle annular portion being in the range of approximately 5 to 20 mm;
wherein the outer annular portion has a radial width that extends radially between the middle annular portion and an outer diameter of the carrier ring, the radial width of the outer annular portion being in the range of approximately 5 to 20 mm.

7. The carrier ring of claim 1, wherein the carrier ring is defined from a ceramic material.

8. The carrier ring of claim 7, wherein the carrier ring has an integrated structure defined from a single piece of the ceramic material.

9. The carrier ring of claim 7, wherein the carrier ring has a multi-part structure defined by multiple pieces of the ceramic material that are joined together.

10. The carrier ring of claim 1, wherein the edge ring is seated over an outer region of the base ring, wherein a radial width of the edge ring sets both a radial width of the middle annular portion and a radial width of the outer annular portion, the edge ring having a height that defines a difference between the second thickness and the third thickness.

11. A carrier ring configured to support a substrate during transport to or from a pedestal of a process tool and surrounding the substrate during processing, the carrier ring comprising,
an annular structure having an inner diameter and an outer diameter, the annular structure having a bottom surface that is substantially coplanar, and a top surface including a plurality of annular tiers;
wherein the annular tiers include,
a first annular tier extending from the inner diameter of the annular structure to a first intermediate diameter greater than the inner diameter, the first intermediate diameter being greater than a diameter of the substrate, the first annular tier having a first height above the bottom surface, the first annular tier defined to be adjacent a substrate support region of the pedestal that is configured to receive the substrate during processing,
a second annular tier extending from the first intermediate diameter to a second intermediate diameter that is greater than the first intermediate diameter and less than the outer diameter of the annular structure, the second annular tier having a second height above the bottom surface, the second height being greater than the first height, and
a third annular tier extending from the second intermediate diameter to the outer diameter of the annular structure, the third annular tier having a third height above the bottom surface, the third height being greater than the second height, wherein the third height is configured to establish a gap between a top surface of the third annular tier and a showerhead of the process tool during processing, wherein the third height is configured to suppress local ignition of plasma in the gap to define a plasma exclusion region below a peripheral region of the showerhead and over the top surface of the third annular tier, the plasma exclusion region surrounding a primary plasma region that is below a central region of the showerhead and over the substrate, the third height further being configured to establish a recirculation zone outside of the third annular tier that causes quenching of radicals on an external surface of the third annular tier;
wherein the second annular tier is configured to be approximately aligned with a top surface of the substrate when present during processing in the process tool when the carrier ring is supported by a carrier support surface surrounding the substrate support region, wherein when the carrier ring is supported by the carrier support surface, the carrier ring does not support the substrate;
wherein a process extension region is defined over the second annular tier during processing of the substrate in the process tool;
wherein the carrier ring includes a base ring and an edge ring, the base ring having one or more recesses, the edge ring having one or more protrusions that respectively fit in the one or more recesses.

12. The carrier ring of claim 11,
wherein the first annular tier is configured to support the substrate from an edge region of the substrate during transport of the substrate;
wherein a transition from the first annular tier to the second annular tier defines an interior-facing wall that provides lateral confinement of the substrate when the substrate is supported by the carrier ring, wherein the interior-facing wall is defined at the first intermediate diameter that is greater than the diameter of the substrate, such that a gap is formed between the interior-facing wall and an outer edge of the substrate when the substrate is supported by the first annular tier.

13. The carrier ring of claim 11, wherein the third annular tier defines a ring wall that prevents back diffusion of parasitic plasma from a surrounding region of the pedestal during processing of the substrate in the process tool.

14. The carrier ring of claim 11, wherein a plasma exclusion region is defined over the third annular tier during processing in the process tool.

15. The carrier ring of claim 11,
wherein the first height is in the range of approximately 1 to 3 mm;
wherein the second height is in the range of approximately 2 to 6 mm, provided the second height is greater than the first height;
wherein the third height is in the range of approximately 7 to 13 mm.

16. The carrier ring of claim 11,
wherein a radial width of the first annular tier defined between the inner diameter of the annular structure and the first intermediate diameter is in the range of approximately 10 to 25 mm;
wherein a radial width of the second annular tier defined between the first intermediate diameter and the second intermediate diameter is in the range of approximately 5 to 20 mm;
wherein a radial width of the third annular tier defined between the second intermediate diameter and the outer diameter of the annular structure is in the range of approximately 5 to 20 mm.

17. The carrier ring of claim 11, wherein the carrier ring comprises a ceramic material.

18. The carrier ring of claim 11, wherein the edge ring is seated over an outer region of the base ring, wherein a radial width of the edge ring sets both a radial width of the second annular tier and a radial width of the third annular tier, the edge ring having a height that defines a difference between the second height and the third height.

* * * * *